United States Patent [19]

Bossen et al.

[11] Patent Number: 4,461,001

[45] Date of Patent: Jul. 17, 1984

[54] DETERMINISTIC PERMUTATION ALGORITHM

[75] Inventors: Douglas C. Bossen; Mu-Yue Hsiao, both of Poughkeepsie, N.Y.

[73] Assignee: International Business Machines Corporation, Armonk, N.Y.

[21] Appl. No.: 362,925

[22] Filed: Mar. 29, 1982

[51] Int. Cl.³ .............................................. G06F 11/00
[52] U.S. Cl. ..................................... 371/38; 365/200; 371/2; 371/11
[58] Field of Search .......................... 371/10, 11, 38, 2; 365/200

[56] References Cited

U.S. PATENT DOCUMENTS

| | | | |
|---|---|---|---|
| 3,644,902 | 2/1972 | Beausoleil | 365/200 |
| 3,781,826 | 12/1973 | Beausoleil | 365/200 |
| 3,812,336 | 5/1974 | Bossen et al. | 371/38 |
| 3,897,626 | 8/1975 | Beausoleil | 365/200 |

Primary Examiner—Charles E. Atkinson
Attorney, Agent, or Firm—James E. Murray

[57] ABSTRACT

Swapping of bits between different words of a memory is accomplished by reference to data on bad bits in the memory. This data controls address inputs to each bit in a memory word so that any word with multiple uncorrectable data is changed to a correctable data word by placing one or more of the bad bits in the word into another word of the memory. The swapping is done by an exclusionary process which deselects certain combinations of addresses thereby limiting the selection process to other combinations. The process can involve categorizing of failures in accordance with type and performing algorithm operations which identify combinations of bit addresses that would result in combining the failures so that there are more errors in any memory word than would be correctable by the error correction code monitoring the memory.

9 Claims, 8 Drawing Figures

CHIP ADDRESSES

FIG. 6

0   1   2   3 ← SECTIONS

LOGICAL CHIP ADDRESSES

FIG. 7

0   1   2   3 ← SECTIONS

DETERMINISTIC PERMUTATION ALGORITHM

BACKGROUND OF THE INVENTION

The present invention relates to the automatic skewing of addresses in a memory to change memory words with uncorrectable errors into memory words with errors than can be corrected by the error correction code protecting the memory.

Error correction and detection schemes for encoding data are known to detect more errors than they are capable of correcting. For instance, a 64 data bit word can be provided with a single error correction and a double error detection capability by usig eight check bits which are stored in the same word location in memory as the 64 data bits. A failure of any single one of the 72 cells which store the data and check bits can be corrected by error correcting circuitry. This same circuitry can also be used to detect double errors existing in the word but generally will not correct these double errors. That is, if a single bit fails the particular defective bit can be identified and, therefore, corrected. However, if two bits fail the occurrence of the failure can be detected but the failing bits generally cannot be pinpointed and, therefore, cannot be corrected.

The term "generally" has been used in connection with double error correction because some of the single error correction codes do correct specific types of double errors such as errors in adjacent bit positions. However, not all double errors will occur in a correctable pattern. Therefore, to repeat what has already been said, an error correction system generally speaking will detect a greater number of errors than it has the capability of automatically correcting.

To take advantage of this capacity of an error correction code to detect more errors than it can correct, Beausoleil U. S. Pat. No. 3,644,902 suggests a means for changing errors that are detectable but uncorrectable into errors that are both detectable and correctable. In the Beausoleil patent, a memory unit is made up of a plurality of arrays each containing all the bits for one bit position in the memory unit. These arrays are each addressed through a decoder that the proper bit of any word is selected from each array when the word is addressed. The Beausoleil patents suggests that, when multiple errors are to be avoided, circuitry be employed that permanently modifies the address supplied to the decoders to swap bits between words by physically swapping the arrays and thereby change words with uncorrectable errors into words with correctable errors.

In Bossen et al U.S. Pat. No. 3,812,336, and in an article entitled "Address Reconfiguration for Large-Scale Integrated Memory Yield Inducement" appearing on page 1245 of the September 1973 issue of the IBM Technical Disclosure Bulletin, an address modification scheme was proposed to form electronic swapping of memory bits. In this scheme the address supplied to the decoder of any particular bit array is modified by logic circuitry as a function of data stored in a shift register associated with the particular bit position of the words in the memory unit. The logic circuitry controlled by each of the registers includes an Exclusive OR gate for each of the inputs of the decoder of the particular bit position. Each of the Exclusive OR gates accepts one digit of the word address and the output of one of the stages of the linear feedback shift register and supplied its output to one of the inputs of the decoder. In the IBM Technical Disclosure Bulletin article, the decoder input address of the bad bit is placed in the shift register so that when the bad bit is requested bit location 0 is accessed instead. In the Bossen et al patent, a different Galois field number is stored in each of the shift registers starting with zero in the shift register of the first bit position and proceeding in the Galois field number sequence to the highest number needed in the shift register of the last bit position. Each time a multiple error is detected, each of the shift registers, except the shift register for the first bit position, is shifted one Galois number. This assures that the detected multiple error will be eliminated by scattering the bits making up the failing word. As a result of this scattering, each of the failing bits end up in a different word changing the uncorrectable multiple error condition into a number of correctable single error conditions.

One advantage of the scheme is that it eliminates a detected multiple error condition in one try. Furthermore, it will not reintroduce previously corrected multiple error conditions in the process. However the scheme can cause new uncorrectable error conditions either in the word being corrected or other words of the memory. The probability of this occurring increases as memories become larger and contain more bad bits. Therefore it is desirable to have a more deterministic method of swapping bits.

The above referenced TDB article shows that once the location of a bad bit is known, its access can be avoided. In addition, test results as to the location of bad bits are used in Beausoleil U.S. Pat. Nos. 3,781,826 and 3,897,626 to divide chips into groups in accordance with the location of the failing bits. In U.S. Pat. No. 3,897,626 these chips are mounted on memory cards with all chips having a defective chip in a given chip section being mounted on a corresponding section of a card. The address wiring is then used to skew the errors so that no memory word contains more than one bad bit. If a failure is detected by an ECC system, an Exclusive ORing of two sections of the address of the failing word will locate the bad or suspicious bit.

BRIEF DESCRIPTION OF THE INVENTION

In accordance with the present invention, the swapping of bits between different words of a memory is accomplished by using data on bad bits in the memory. The permutation of the bit addresses is done by an exclusionary process which identifies address combinations which result in alignment of bit failures that are uncorrectable in the error correction system of the memory and then limiting the selection process to other combinations. In the preferred embodiment, failures are categorized by type, such as a chip, line or bit failure to determine uncorrectable combinations of failures. The bit addresses are then permutted in order of decreasing number of failures.

Therefore, it is an object of the present invention to provide a scheme for swapping bits in memory words to change uncorrectable error conditions into correctable error conditions.

It is another object of the present invention to swap bits in memory words using fault data on bad cells in the memory.

An additional object of the invention is to swap bits in memory words based on known error conditions existing in the memory categorized by the type of error.

THE DRAWINGS

This and other objects of the present invention can be best understood by reference to the figures of the drawings of which.

DETAILED DESCRIPTION OF THE INVENTION

Figure 1:
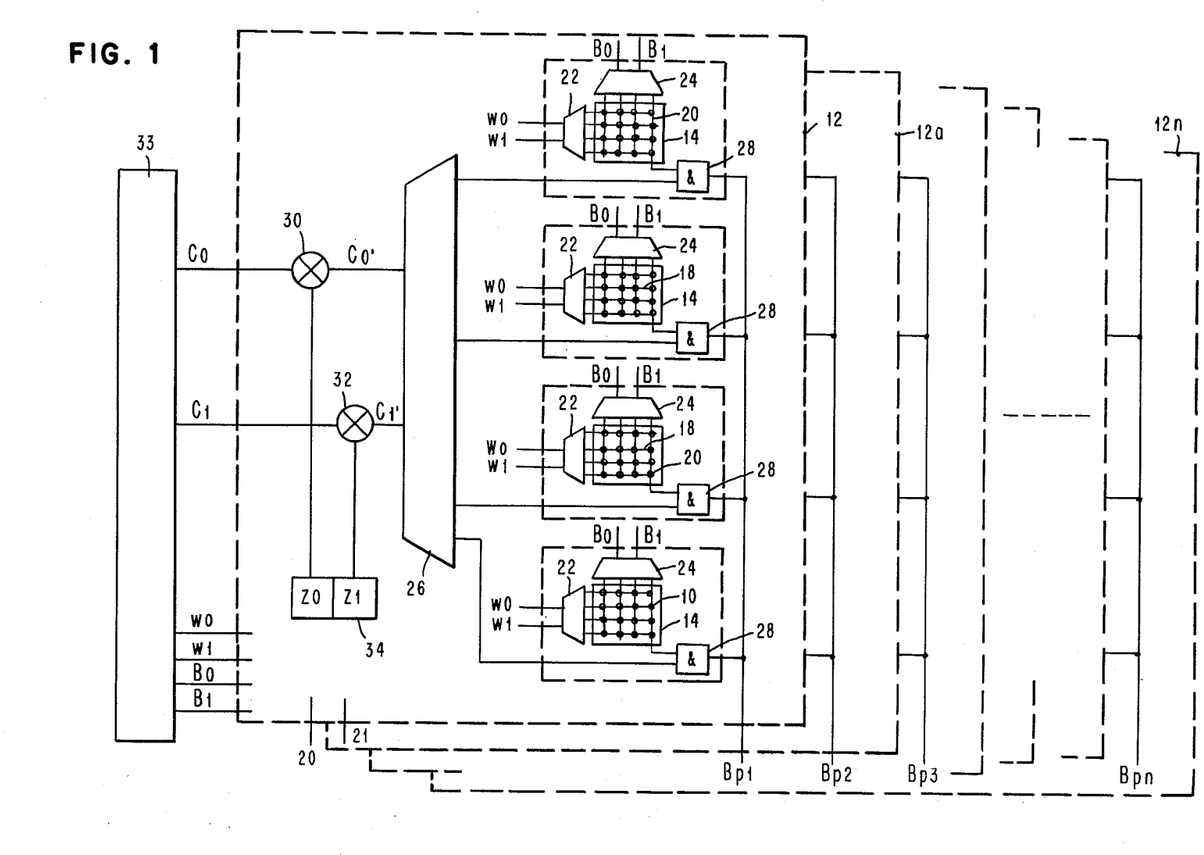
FIG. 1 is a schematic of a memory employing the present invention.

As shown in FIG. 1, the storage cells 10 of each bit position $B_1$ to $B_{72}$ of a plurality of 72 bit memory words are each arranged on separate identical cards 12 in a plurality of arrays 14. The arrays 14 are 16 bit arrays with each bit 10 located at a different intersection of one of 20 four word lines 18 with one of four bit lines 20. The arrays 14 are each accessed thru a different word decoder 22 and bit decoder 24 which receive identical 2 bit address signals $W_0$, $W_1$ and $B_0$, $B_1$ respectively.

In addition to a word and bit decoder associated with each array each card 12 also contains a chip decoder 26 which receives a two bit address $C_0'$, $C_1'$. The bit decoder selects the output of one of the four arrays 14 on each card 12 by enabling AND gate 28.

The chip address bits $C_0'$ and $C_1'$ are each the output of an Exclusive OR circuit 30 or 32 that receives one address input $C_0$ or $C_1$ from the address register 33 and another input $Z_0$ or $Z_1$ from a different stage of a shift register 34. Therefore, if $Z_0$ and $Z_1$ are both zero, the chip decoder 26 will access the array requested by the address register 33. With any other binary combination of $Z_0$ and $Z_1$ in the shift register 34, the chip decoder 26 will access one of the other three arrays.

To summarize then, the memory address register transmits the same six address bits $C_0$, $C_2$, $W_0$, $W_1$, and $B_0$, $B_1$ to all cards 12a to 12n. In each card 12 address bits $W_0$, $W_1$ and $B_0$, $B_1$ access the same cell 10 in four different arrays 14. The address bits $C_0'$, $C_1'$ select the output of one of those chips on each card to be read out as one of the bits $B_1$ to $B_{72}$ of the accessed word. If $Z_0$ and $Z_1$ are both zero, this will be the same bit position in the same array on all cards. If the register 34 on any card contains data other than zeros the bit output $B_i$ of that card will be a bit in the same position of another array 14 of the card.

Figure 2:
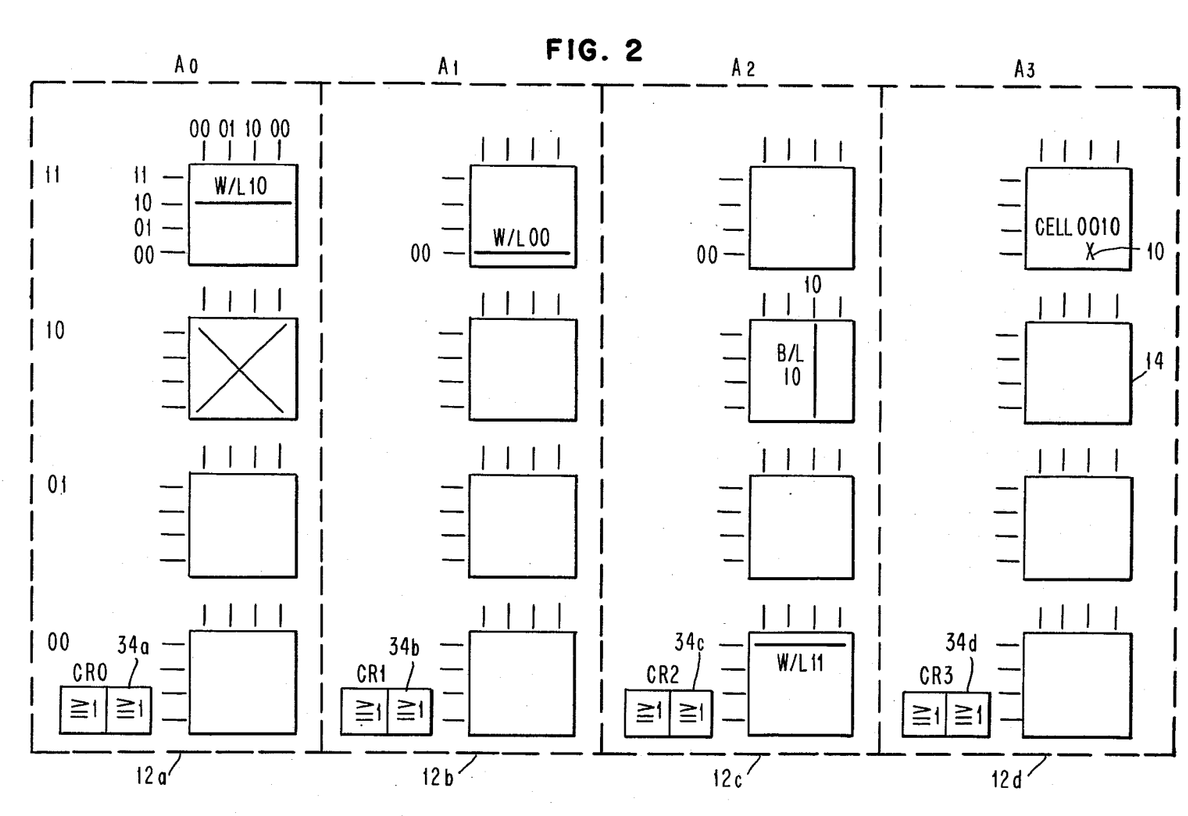
FIG. 2 is a diagrammatic representation of a set of faults in the memory of FIG. 1.

In accordance with the present invention, the data placed in the register 34 is selected on the basis of stored information on defects or faults of the chips. In the illustrated embodiment, these faults are categorized by type. That is, the stored data specifies what type of failure exists on the chip. This fault characterization can be better understood by reference to FIG. 2. FIG. 2 shows four cards 14 in the memory of FIG. 1 with different types of faults that can occur in a semiconductor memory. All the bits on chip 10 in the first card $A_0$ are bad. This is referred to as a chip failure or chip kill. A chip failure or kill will be identified by giving the address of the chip followed by four X's (10, XXXX). Card $A_0$ also has a chip 11 where all the bits on a word line are bad. This is called a word line failure. A word line failure is represented by indicating which chip and which word line has failed then followed by two X's (11, 10, XX). The third type of possible failure is where all the bits arranged along a single bit line do not respond. This is referred to as a bit line failure. On card $A_2$ bit line 10 on chip 10 is so defective. A bit line failure will be indicated by identifying the chip and bit line location of the failing bit line separated by two X's (10, XX, 10). The final type of failure is a bit failure. One can be seen in chip 11 of card $A_3$. A bit failure is identified by the chip, word and bit line locations of the failing bit (00, 00, 10).

A number of different failures of the types discussed above are shown in FIG. 2. A fault map for identifying the failing bits would be as follows:

$\{A_{0j}\} = 10,XX,XX; 11,10,XX$
$A_{1j} = 11,00,XX$
$A_{2j} = 00,11,XX; 10,XX,10$
$A_{3j} = 11,00,10$ where:

$\{A_{ij}\}$ = known failures in arrays containing bits for bit location i.

XX = all bad at listed address bits.

It can be seen from FIG. 2 that a number of data words of this simplified memory would have multiple error conditions when $Z_1$ and $Z_2$ are both set equal to "0" in all registers 34 of all the cards. Word 110010 has a multiple error condition as a result of a word line failure in card $A_1$ and a bit line failure in card $A_3$. Words 100010, 100110, 101010, and 101110 all have multiple errors as a result of a chip failure in card $A_0$ and a bit line failure in card $A_2$.

As described in U.S. Pat. No. 3,812,336 these multiple error conditions can be eliminated by changing the data in one or more of the registers 34. It should be apparent that the double error condition in word 110010 could be eliminated by using a bit in one of the perfect chips in $A_3$. This can be accomplished by changing the contents of register 34d from 00 to 01, 10 or 11. However in selecting the contents of register 34d care must be taken not to introduce or aggravate multiple error conditions on other word lines of the memory. This is accomplished in the present invention by algorithmically coded processor means that examines the data in a fault map such as the one listed above for the various conflicts that arise for different combination of the contents of registers 34.

Let $CR_1$, $CR_2$ ... $CR_n$ be contents of the n control registers where each $CR_i$ is r bits long. Let $\{A_{ij}\}$ be the set of bad bits in a card basis. Given the set of bad bit addresses $A_{ij}$ the contents of control registers $CR_i$ must be chosen so that the sets $CR_1 \oplus \{A_{1j}\}$, $CR_2 \oplus \{A_{2j}\}$ ... $CR_n \oplus \{A_{nj}\}$ are disjoint. This can be down by computing the control register contents in accordance with the followig algorithm. Or in other words, the contents of the register must be such that none of the errors are placed in the same word. This can be accomplished as follows.

Figure 4:
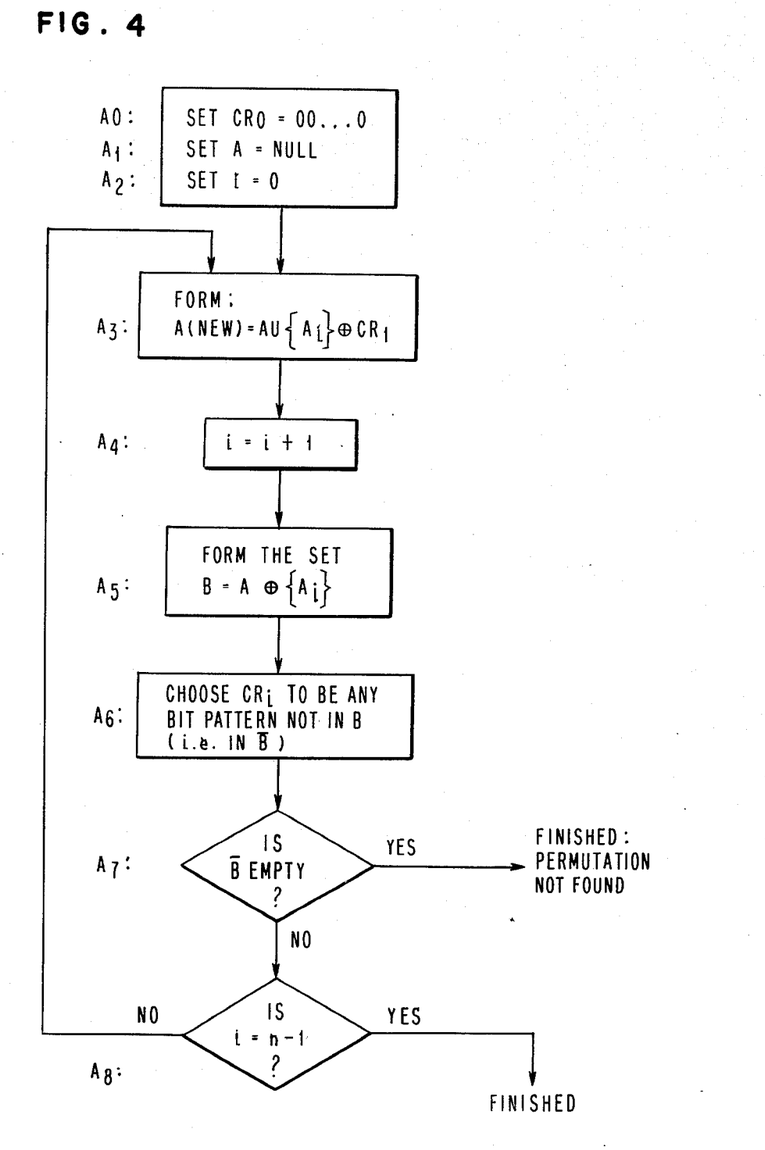
FIG. 4 is a flow diagram for rearranging uncorrectable errors in accordance with the present invention.
Figure 5:
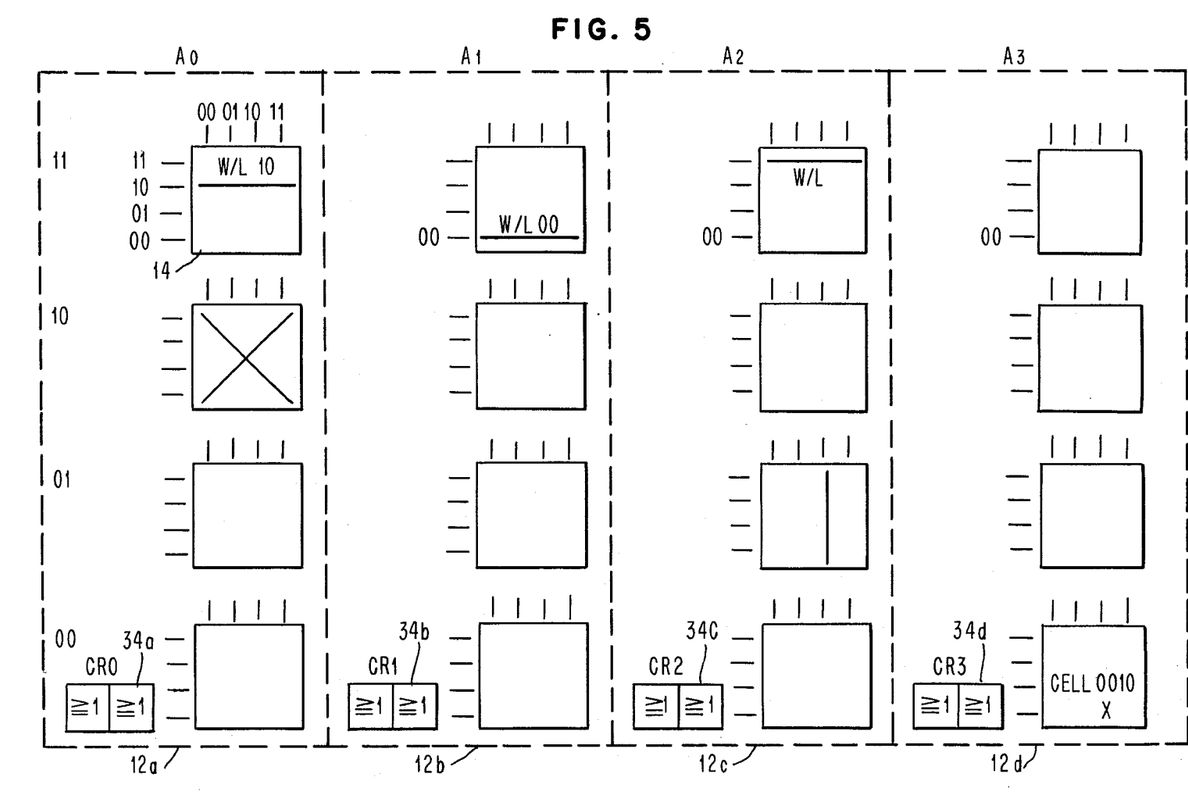
FIG. 5 is a diagrammatic representation of the faults of FIG. 2 after the memory accessing has been structured in accordance with the algorithm illustrated in FIG. 4.

| Step | | |
|---|---|---|
| A0 - Set | $CR_0 = 00$ | |
| A1 - Set | A = null | |
| A2 - Set | i = 0 | |
| A3 - Calc | $A = A \cup A_{ij} + CR_i$ | |
| A4 - Set | i to i+1 | |
| A5 - Calc | $B_i = A \oplus \{A_{ij}\}$ | |
| A6 - Set | $CR_i = \overline{B_i}$ (Any element not in $B_i$) | |
| A7 - | if $\overline{B_i}$ is empty (a null set), terminate. | |
| A8 - | if i = n−1, exit; else go to A3 and proceed again. | | where
  $A_i$ = the set of faulty addresses on card i
  i = any card 0, ..., n−1
  A = a set of accumulated permutted faulty addresses determined and used by the algorithm.

The algorithm can be implemented in APL where A is the list of all faulty address permuted up until that point in the algorithm listed by logical addresses. $\oplus$ is the Exclusive OR function defined by the following truth table.

| EX OR operation | 0 | 1 | X |
|---|---|---|---|
| 0 | 0 | 1 | X |
| 1 | 1 | 0 | X |
| X | X | X | X | where X, 0, 1 are defined by the following truth table.

| Symbol Name | Binary Code $X_1$ $X_2$ | |
|---|---|---|
| 0 | 0 | 0 |
| 1 | 1 | 1 |
| X | 0 | 1 |

Figure 3:
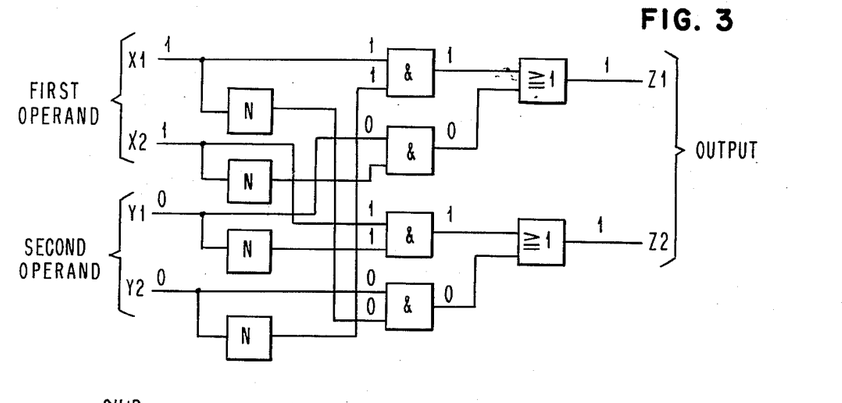
FIG. 3 is a circuit diagram of an Exclusive OR circuit for use with the memory of FIG. 1.

These two tables define the operation of the Exclusive OR circuit of FIG. 3 which could be used in a hardware implementation. It can be used to calculate Steps A3 and A5 in the previously mentioned algorithm.

A0 $CR_0 = 00$
A1 $A = \emptyset$
A2 $i = 0$

A3 $A = A \cup \{A_{0j}\} \oplus CR_0 = \emptyset \cup \{10XXX, 11\ 10\ XX\} \oplus \{00----\}$
   = {10 XXXX, 11 10XX}

A4 $i\ 0 + 1$
A5 $B_1 = A \oplus \{A_{ij}\} = \{10\ XXXX, 11\ 10XX\} \oplus \{11\ 00\ XX\}$
   $B_1 = \{01\ XXXX, 00\ 10\ XX\}$ $$\downarrow$$

A6 $\overline{B_1} = \begin{Bmatrix} & 0000 \\ 10 & 0001 \\ 00\ XXXX, 0011\ XX \\ 11 \\ & 1111 \end{Bmatrix} \longrightarrow$ pick up 000000 $CR_1 = 00$ A7 Go to A3
A3 $A = A \cup \{A_{1j}\} \oplus CR_1 = \{10XXXX, 1110XX\} \cup \{1100XX\} \oplus$
   $\{00----\}$
   $A = \{10XXXX, 1110XX, 1100XX\}$ A4 $i = 1 + 1$
A5 $B_2 = A \oplus \{A_{2j}\} = \{10XXXX, 1110XX, 1100XX\} \oplus$
   $\{0011XX, 10XX\}$
   $B_2 = \{10XXXX, 1101XX, 01XXXX, 1111XX, 00XXXX\} \longrightarrow$ A6 Pick up $CR_2 = 11$ since 110000 not in B
A7 Go to A3
A3 $A = A \cup \{A_{2j}\} \oplus CR_2$
   $A = \{10XXXX, 1110XX, 1100XX\} \cup \{0011XX, 10XX10\} \oplus$
   $\{110000\}$
   $A = \{10XXXX, 1110XX, 1100XX, 1111XX, 01XX10\}$ A4 $i = 2 + 1$
A5 $B_3 = A \oplus \{A_{3j}\}$
   $B_3 = \{10XXXX, 1110XX, 1100XX, 1111XX, 01XX10\} \oplus$
   $\{110010\}$
   $B_3 = \{01XXXX, 0010XX, 0000XX, 0011XX, 10XX00\}$ A6 Pick $CR_3 = 11$ since 110000 not in $B_3$.

This algorithm may have other implementation software. Following is one possible way to do this. The representation of the faults is tailored to decimal notation rather than binary due to the way most programming languages operate.

Figure 6:
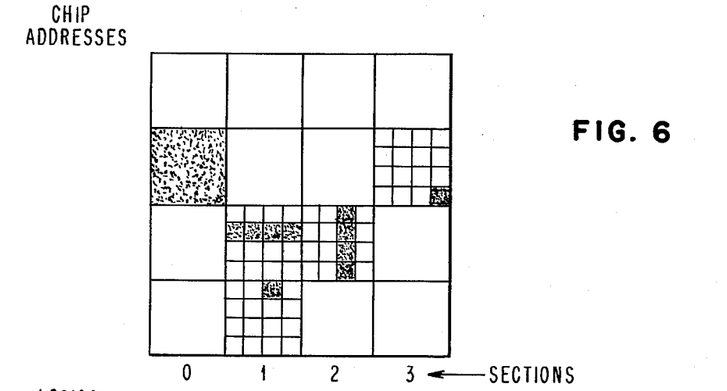
FIG. 6 is a diagrammatic representation of a second set of faults in the memory of FIG. 1.

FIG. 6 shows a four bit array similar to the one shown in FIG. 2 except the address bit notation is decimal instead of binary. The darkened areas in FIG. 6 represent the faulty bits of the memory. The following fault map can be generated from FIG. 6.

| Section | Array | Word Line | Bit Line |
|---|---|---|---|
| 0 | 2 | 0 | 0 |
| 1 | 0 | 4 | 3 |
| 1 | 1 | 3 | 0 |
| 2 | 1 | 0 | 3 |
| 3 | 2 | 1 | 4 |

Figure 7:
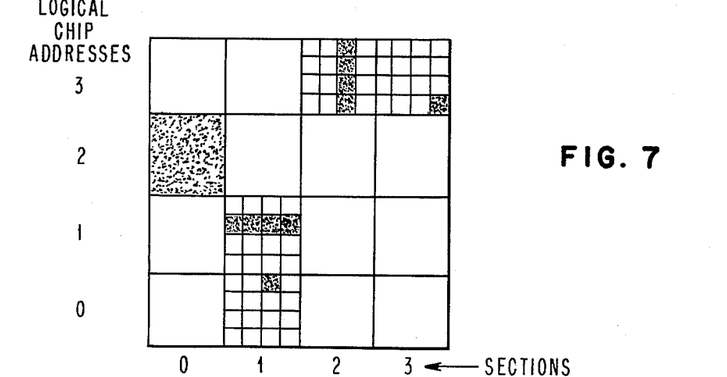
FIG. 7 is a diagrammatic representation of the faults of FIG. 6 after the memory addressing has been structured in accordance with FIG. 4.

It is readily apparent from FIG. 6 that there were UE's in words (1,3,3) and (2,1,4). First to see how the decimal notation works suppose that we apply a CR value of 2 to section 2 and a CR value of 1 to section 3. Then the logical address of the faulty chip in section 2 will change from 1 to 3, which is the Exclusiv-OR of 1, its physical address, with 2, the CR value applied. Similary, the logical address of the faulty chip in section 3 changes from 2 to 3 = 2 + 1. Thus the memory has effectively been reconfigured to the form of FIG. 7, from which we can see that no UE's remain. Now having seen that a judicious choice of CR values may enable us to disperse UE's in the embodiment of FIG. 6, we are going to restate the CR selection algorithm so that it is suitable for use in writing a program in APL.

In more detail, the algorithm proceeds as follows:
1. Let $A_0$ be a list of the faults in section 0. Then at any point in the execution of the algorithm, A will be a list of the faults permuted up until that point, with the logical addresses of the faults as their chip addresses. We do not permute section 0; that is, we take CR = 0.
2. Set N = 0.
3. Increase N by 1.
4. Set I = 0.
5. Increase I by 1.
6. Let AN represent faults in section N, and ANI, the Ith fault in AN. Let CANHIT be the set containing the (logical) chip addresses of all faults in A having the property that ANI would cause a UE with the fault if section N were permuted so that ANI occupied the same logical chip address as the fault. Then we want to eliminate those CR values which would cause ANI to have as its logical chip address one of the elements of CANHIT, that is, those values of CR for which
(phys. chip addr. of ANI) E CR⊕CANHIT, or,
CR⊕(phys. chip addr. of ANI) E CANHIT.
Thus, we Exclusive-OR the values in CANHIT with the physical chip address of ANI, and eliminate the resulting values from the set of CR values under consideration.

7. If I is less than the number of faults in AN, then go to step 5.
8. If there are any possible values of CR that have not been eliminated, choose one of them (say for example, the first one) to be the CR value for the Nth section. Otherwise, terminate, having failed to disperse all of the UE's in the memory.
9. If N is less than the number of the last section in the memory, then go to step 3. Otherwise, we have successfully dispersed all of the UE's in the memory.

The following APL program can be found as an appendix to this application.

Let us follow the algorithm section by section as it works on our sample memory of FIG. 6.

Section 0: Since there is no need to permute section 0, we take CR=0. A is now the 1×4 matrix (0,2,0,0).

Section 1: A1 is the 2×4 matrix $$\begin{matrix} 1 & 0 & 4 & 3 \\ 1 & 1 & 3 & 0, \end{matrix}$$

so that A11=(1,0,4,3). CANHIT=2, since the chip-kill (9,2,0,0) would cause a UE with A11 if they were put into the same logical chip address. Thus, we eliminate the CR's satisfying CR (phys. chip addr. of A11)+CANHIT, or

CR0+2, or CR=2. The choices left for CR are now 0, 1, and 3.
A12=(1,1,3,0), and CANHIT is still 2, so we want to eliminate the CR value 3=1+2. The choices left for CR is now 0 and 1. We choose CR=0, so that the result is that we do not permut section 1 at all. We now have $$A = \begin{matrix} 0 & 2 & 0 & 0 \\ 1 & 0 & 4 & 3 \\ 1 & 1 & 3 & 0 \end{matrix}$$

Section 2: A2=(2,1,0,3), CANHIT=0,1,2. Eliminate CR's satisfying

CR1⊕0,1,2=1,0,3.

The only CR value remaining now is CR=2. Applying it, the logical address of the fault in A2 becomes (2,3,0,3), so that $$A = \begin{matrix} 0 & 2 & 0 & 0 \\ 1 & 0 & 4 & 3 \\ 1 & 1 & 3 & 0 \\ 2 & 3 & 0 & 3. \end{matrix}$$

Section 3: A3=(3,2,1,4), CANHIT=2. We eliminate CR=0=2 2. Remaining choices for CR are 1,2,3.

Choose CR=1, so that the logical address of the fault in A3 becomes (3,3,1,4). Finally, we have $$A = \begin{matrix} 0 & 2 & 0 & 0 \\ 1 & 0 & 4 & 3 \\ 1 & 1 & 3 & 0 \\ 2 & 3 & 0 & 3 \\ 3 & 3 & 1 & 4. \end{matrix}$$

One simple yet powerful enhancement which has been made on the basic algorithm concerns the order in which the algorithm considers the sections of the memory. As we have described it above, the algorithm goes through the memory sequentially "from left to right," that is, it takes the sections in the order 0,1,2, . . . It is possible to improve the algorithm a great deal by using a method of section ordering which takes into account the particular fault map under consideration, rather than using the same arbitrary ordering for all situations.

In general, this algorithm involves ordering of the sections in accordance with the number of errors. At a particular point in the execution of the algorithm, the "worse" the section for which we are attempting to find a CR value is, that is, the more "defective" the section is, the less choice we will have for its CR value. Also, all other things being equal, the more faults there are which have already been considered in the algorithm, the more logical addresses in the memory have already been occupied by the faults in the set "a," so that the less choice we have for a CR value. Thus, the algorithm is most likely to be unsuccessful, that is, unable to find a suitable CR for some section, if it considers the "worst" sections last. It is reasonable, then for us to take the sections in order from the "worst" to the "best".

To specify such an ordering scheme precisely, we need to decide precisely what we mean by "worst". One simple way of ordering the sections which has been quite successful defines the "worst" section to be the one containing the most defective cells. Thus, to use this scheme in our algorithm, we take the section with the most defective cells first, the one with the next highest number second, and so on. In the illustrated memory, each bit-line or word-line fault counts as 4 faulty cells, and each chip-kill counts as 16 faulty cells.

As an example, we note that use of the above ordering method on the memory of FIG. 6 causes the algorithm to take the sections in the order 0,1,2,3, so that the algorithm is successful.

Of course, other ordering methods are possible. For example, we might choose to define the "worst" section to be the one which has the fewest completely defect-free chips.

One variation we may make in the implementation of address permutation is to permute word lines and/or bit line addresses along with the chip addresses.

Another variation is to modify step A7 so that if $\overline{B}$ is empty, the algorithm backs up to a previous choice of CR value, and makes a different choice where more than one was possible.

Figure 8:
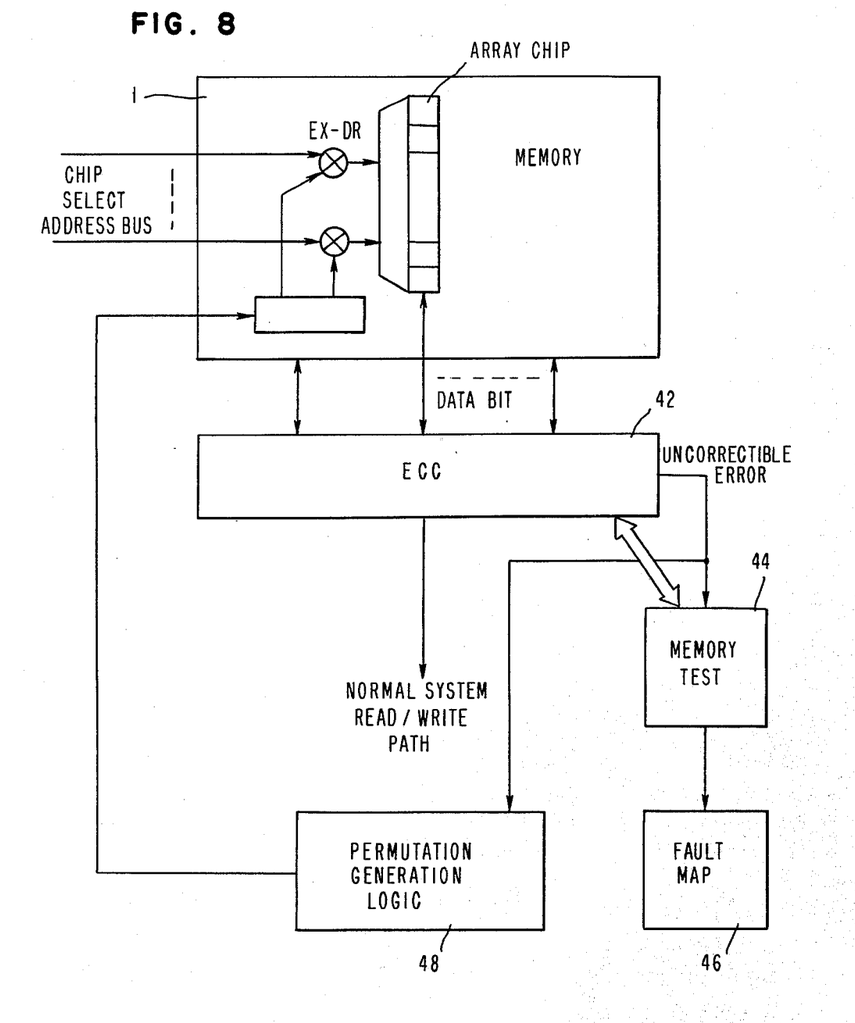
FIG. 8 is a block diagram of an error correcting system employing the present invention.

In FIG. 8, a memory 40 such as that shown in FIG. 1 is checked by conventional error correction apparatus 42. The occurrence of an uncorrectable error (UE) signal from the apparatus initiates testing of the memory array by tester 44. The tester is a device for application test patterns to the memory location containing the UE. For instance, the tester could apply a pattern of all 1's followed by a pattern of all zeros to the flawed memory location to determine bits stuck at 0 or 1 respectively. When the faulting bits have been identified, their address is stored in memory in a fault map in the manner described in the present application or an other mapping suitable for the purpose.

The UE condition also initiates operation of the permutation generation logic 48 to change data in the registers 34 of the memory to eliminate the UE condition. In accordance with the present invention, the permutation generator is a microcoded processor 48 capable of executing the algorithm set forth above.

The output of the permutation generator is the CR values for the various bit positions of the memory so these CR values are fed into the latches 34. The latches can be stages of an LSSD shift register. So the data could be shifted along the LSSD chain into the proper stages.

Above we have described one embodiment of the invention and other embodiments are possible. For instance, the location of one bit position could be in a single array as shown in the previously mentioned U.S. Pat. No. 3,812,336. In addition, the word and bit lines could be permuted.

Therefore it should be understood that many modifications and changes can be made in the illustrated embodiments without departing from the spirit and scope of the invention as represented in the attached claims.

Having thus described our invention, what we claim as new, and desire to secure by Letters Patent is:

1. In a memory system with data bits or storage locations arranged in logical data words made up of storage locations in a plurality of bit positions accessed by different decoder means that are all addressed by the same set of location address bits for a logical data word through different permuting means that converts the logical address bits to a set of physical address bits of an actual storage location accessed by each decoder as a function of permutation data bits supplied to the particular permuting means for the purpose of giving faulty storage locations at the same actual storage location in different bit positions different logical addresses so as to eliminate error conditions that are uncorrectable by the error correcting code protecting the memory system, the improvement comprising:
   error detection means for determining the location of faulty data bits in the memory;
   storage means for storing the address bit locations of known faulty data bits of the memory, and
   means responsive to the data stored in the storage means for selecting the permutation bits and accessing any bit position of the memory on the basis of known logical addresses of any faulty data bits in other bit positions and the physical address of any faulty data bits in said any position.

2. The memory system of claim 1 wherein said logical address bits = permutation data bits $\oplus$ physical address bits.

3. The method of claim 1 including selecting the permutation bits $CR_{ij}$ determining any bit position from the set not including $A \cup \{A_{ij}\}$
   where $A$ = the set or sets of logical address bits for all faults in bit positions where permutation bits CR have already been selected,
   $A_{ij}$ = the set or sets of physical address bits of all faults in said any bit position ij.

4. The memory of claim 1 wherein the storage locations of any bit position are arranged in a plurality of arrays and said permutation bits $CR_i$ convert logical address bits selecting one of said plurality of arrays.

5. The memory of claim 1 wherein the storage locations of any bit position ij are arranged in a single array and said permutation bits convert logical address bits selecting a row address of a storage location in said array.

6. The method of claim 3 including selecting permutation bits for each of said bit positions one after the other in sequence.

7. The method of claim 6 including selecting permutation bits for said bit positions in the order of the decreasing number of known faults in the bit positions.

8. In a memory system with memory space arranged in logical data words each word with its bit positions all accessed by the same logical address bits through different permuting means which convert the logical address to an actual address bits of a data bit of the bit position on the basis of permutation bits that are selected to distribute faulty data bits among the logical data words and thereby eliminate error conditions in the logical data words that are uncorrectable by the error correcting code protecting the memory system, the method comprising:
   selecting the permutation bits of the bit positions of the memory one bit position after the other in a selection sequence on the basis of known logical addresses of faults in all bit positions where permutation bits were already selected in the selection sequence and the actual address of faults in the bit position being selected.

9. The memory system of claim 8 wherein the selecting of the permutation bits is initiated in the bit location containing the most faults and proceeds to the bit location containing the least amount of faults.

* * * * *